US011522371B2

(12) United States Patent
Sekiguchi et al.

(10) Patent No.: US 11,522,371 B2
(45) Date of Patent: Dec. 6, 2022

(54) POWER-SUPPLY CONTROL DEVICE FOR SECONDARY BATTERY AND LOAD VIA REPLY, AND MOVABLE BODY

(71) Applicant: HONDA MOTOR CO., LTD., Tokyo (JP)

(72) Inventors: Satoshi Sekiguchi, Wako (JP); Takeshi Itagaki, Wako (JP); Kazutaka Yoshimura, Wako (JP); Kosuke Murata, Wako (JP); Hironori Deno, Wako (JP); Yuto Fukusho, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 44 days.

(21) Appl. No.: 17/192,130

(22) Filed: Mar. 4, 2021

(65) Prior Publication Data
US 2021/0288508 A1  Sep. 16, 2021

(30) Foreign Application Priority Data
Mar. 11, 2020  (JP) ............................. JP2020-042051

(51) Int. Cl.
*H02J 7/00* (2006.01)
*H01M 10/48* (2006.01)
*B60L 58/12* (2019.01)
*H01M 10/44* (2006.01)
*G01R 31/392* (2019.01)

(52) U.S. Cl.
CPC ............ *H02J 7/0024* (2013.01); *B60L 58/12* (2019.02); *H01M 10/44* (2013.01); *H01M 10/48* (2013.01); *G01R 31/392* (2019.01)

(58) Field of Classification Search
CPC ...... H02J 7/0024; H02J 7/0029; H02J 7/0031; H02J 7/0047; B60L 58/12; H01M 10/44; H01M 10/48; G01R 31/392
USPC ................................ 320/117; 307/11, 31–38
See application file for complete search history.

(56) References Cited

U.S. PATENT DOCUMENTS

| 2015/0229115 A1* | 8/2015 | George ............ H01R 13/65914 174/72 A |
| 2017/0030316 A1* | 2/2017 | Sekiguchi ........... F02N 11/0866 |
| 2017/0144553 A1* | 5/2017 | Steele ................... B60L 3/0046 |

FOREIGN PATENT DOCUMENTS

JP             5097020             9/2012

* cited by examiner

*Primary Examiner* — Nathaniel R Pelton
(74) *Attorney, Agent, or Firm* — Rankin, Hill & Clark LLP

(57) ABSTRACT

A power-supply control device includes a processor that performs a battery abnormality recognizing process and a control process. In the control process, the processor performs a first power-supply control operation of enabling supply of electric power from a secondary battery to a first load by a first connection circuit and supply of electric power from a secondary battery to a second load by a second connection circuit and, when an abnormality of the secondary battery is recognized in the battery abnormality recognizing process, performs a second power-supply control operation of controlling the first relay into a disconnected state to stop the supply of electric power from the secondary battery to the first load by the first connection circuit and maintain the supply of electric power from the secondary battery to the second load by the second connection circuit.

4 Claims, 2 Drawing Sheets

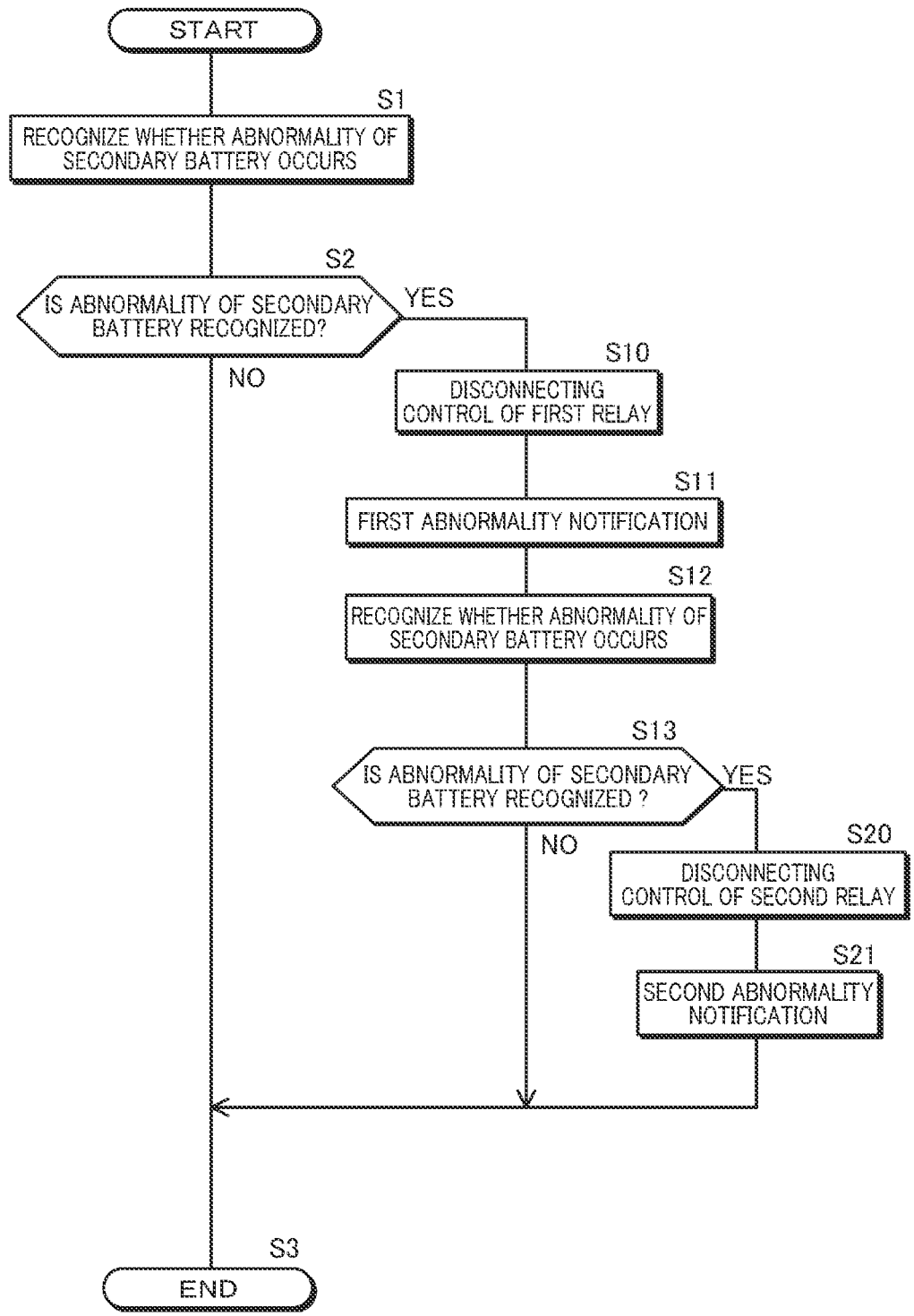

POWER-SUPPLY CONTROL DEVICE FOR
SECONDARY BATTERY AND LOAD VIA
REPLY, AND MOVABLE BODY

INCORPORATION BY REFERENCE

The present application claims priority under 35 U.S.C. § 119 to Japanese Patent Application No. 2020-042051 filed on Mar. 11, 2020. The content of the application is incorporated herein by reference in its entirety.

BACKGROUND OF THE INVENTION

Field of the Invention

The present invention relates to a power-supply control device and a movable body.

Description of the Related Art

A vehicle has been conventionally known which is provided with a high-voltage secondary battery and a low-voltage secondary battery charged by the high-voltage secondary battery and in which a lithium-ion battery is used as the high-voltage secondary battery and a lead storage battery is used as the low-voltage secondary battery (see Japanese Patent No. 5097020, for example).

Since the lead storage battery mentioned above is less prone to a problem of degradation in performance due to over-discharge, by adopting a configuration in which a load to be constantly operated is directly connected to the lead storage battery, the function of the load can be maintained. On the other hand, in the case of using a secondary battery such as a lithium-ion battery, which is subject to the problem of degradation in performance due to over-discharge, a possible configuration is to connect the secondary battery and the load via a relay and, when an abnormality of the secondary battery is detected, put the relay into a disconnected state to protect the secondary battery.

However, this configuration has a disadvantage that the function realized by the load is lost when the relay is put into the disconnected state and the supply of electric power to the load is stopped.

The present invention has been made in view of the above background and has an objective to provide a power-supply control device and a movable body that can maintain the supply of electric power from a secondary battery to a particular load while protecting the secondary battery when an abnormality of the secondary battery occurs.

SUMMARY OF THE INVENTION

A first aspect for achieving the above-mentioned objective includes a power-supply control device that controls supply of electric power from a secondary battery to a first load and a second load, the power-supply control device including: a first connection circuit connecting the first load and the secondary battery; a second connection circuit connecting the second load and the secondary battery; a first relay provided in a middle of the first connection circuit; and a processor that performs a battery abnormality recognizing process of recognizing an abnormality of the secondary battery and a control process of performing a first power-supply control operation of controlling the first relay into a conductive state to enable supply of electric power from the secondary battery to the first load by the first connection circuit and supply of electric power from the secondary battery to the second load by the second connection circuit and, when an abnormality of the secondary battery is recognized in the battery abnormality recognizing process during the first power-supply control operation, performing a second power-supply control operation of controlling the first relay into a disconnected state to stop the supply of electric power from the secondary battery to the first load by the first connection circuit and maintain the supply of electric power from the secondary battery to the second load by the second connection circuit.

The above-mentioned power-supply control device may include: a conduction path provided between the secondary battery and the first relay, the conduction path being shared by the first connection circuit and the second connection circuit; and a second relay provided in a middle of the conduction path, wherein in the control process, the processor performs a third power-supply control operation of controlling the second relay into a disconnected state when the second power-supply control operation of controlling the first relay into the disconnected state is performed and a state in which an abnormality of the secondary battery is recognized in the battery abnormality recognizing process is still not resolved.

Here, the first relay and second relay mentioned above may be contact relays (mechanical relays) or non-contact relays (semiconductor relays), and may be any components as long as they can control a contact to switch between a conductive state and a disconnected state.

The above-mentioned power-supply control device may include a fuse provided in a middle of the first connection circuit, wherein the fuse is blown when passage of current at a level greater than or equal to a predetermined level occurs.

A second aspect for achieving the above-mentioned objective includes a movable body including: a power-supply control device that controls supply of electric power from a secondary battery to a first load and a second load, the power-supply control device including: a first connection circuit connecting the first load and the secondary battery; a second connection circuit connecting the second load and the secondary battery; a first relay provided in a middle of the first connection circuit; and a processor that performs a battery abnormality recognizing process of recognizing an abnormality of the secondary battery and a control process of performing a first power-supply control operation of controlling the first relay into a conductive state to enable supply of electric power from the secondary battery to the first load by the first connection circuit and supply of electric power from the secondary battery to the second load by the second connection circuit and, when an abnormality of the secondary battery is recognized in the battery abnormality recognizing process during the first power-supply control operation, performing a second power-supply control operation of controlling the first relay into a disconnected state to stop the supply of electric power from the secondary battery to the first load by the first connection circuit and maintain the supply of electric power from the secondary battery to the second load by the second connection circuit; and an electric motor, wherein when an abnormality of the secondary battery is recognized in the battery abnormality recognizing process and the second power-supply control operation is performed in the control process, the supply of electric power from the secondary battery to the second load by the second connection circuit is maintained, the second load including one or more of a wiper, a headlight, a power steering, an ignition, an electric parking brake (EPB), an engine water pump, a fuel injector (FI), an anti-lock braking system (ABS), an all-wheel drive (AWD) system, or a drive-by-wire (DBW) system, and the first relay in the first connection circuit is controlled into the disconnected state, and the supply of electric power from the secondary battery to the first load is disconnected, the secondary battery being located upstream from the first relay in the first connection circuit, the first load being located downstream from the first relay in the first connection circuit, the first load including at least a DC-DC converter and not including the second load.

In the above-mentioned movable body, the first load disconnected from the secondary battery located upstream in the first connection circuit and located downstream in the first connection circuit may include one or more of an audio device or an air-conditioner.

According to the above-mentioned power-supply control device, when an abnormality of the secondary battery is recognized during the first power-supply control operation of controlling the first relay into the conductive state to enable supply of electric power from the secondary battery to the first load by the first connection circuit and supply of electric power from the secondary battery by the second connection circuit, the control section performs the second power-supply control operation of controlling the first relay into the disconnected state to stop the supply of electric power from the secondary battery to the first load by the first connection circuit and maintain the supply of electric power from the secondary battery to the second load by the second connection circuit.

Thus, when an abnormality of the secondary battery occurs due to an abnormality of the first load, such as flowing of overcurrent from the secondary battery to the first load due to a failure of the first load, it is possible to resolve the abnormality of the secondary battery to protect the secondary battery and maintain the supply of electric power to the second load.

BRIEF DESCRIPTION OF THE DRAWINGS

FIG. 2 is a flow chart of a first power-supply control operation and a second power-supply control operation.

DETAILED DESCRIPTION OF THE PREFERRED EMBODIMENTS

1. Configuration of Power-Supply Control Device

Figure 1:
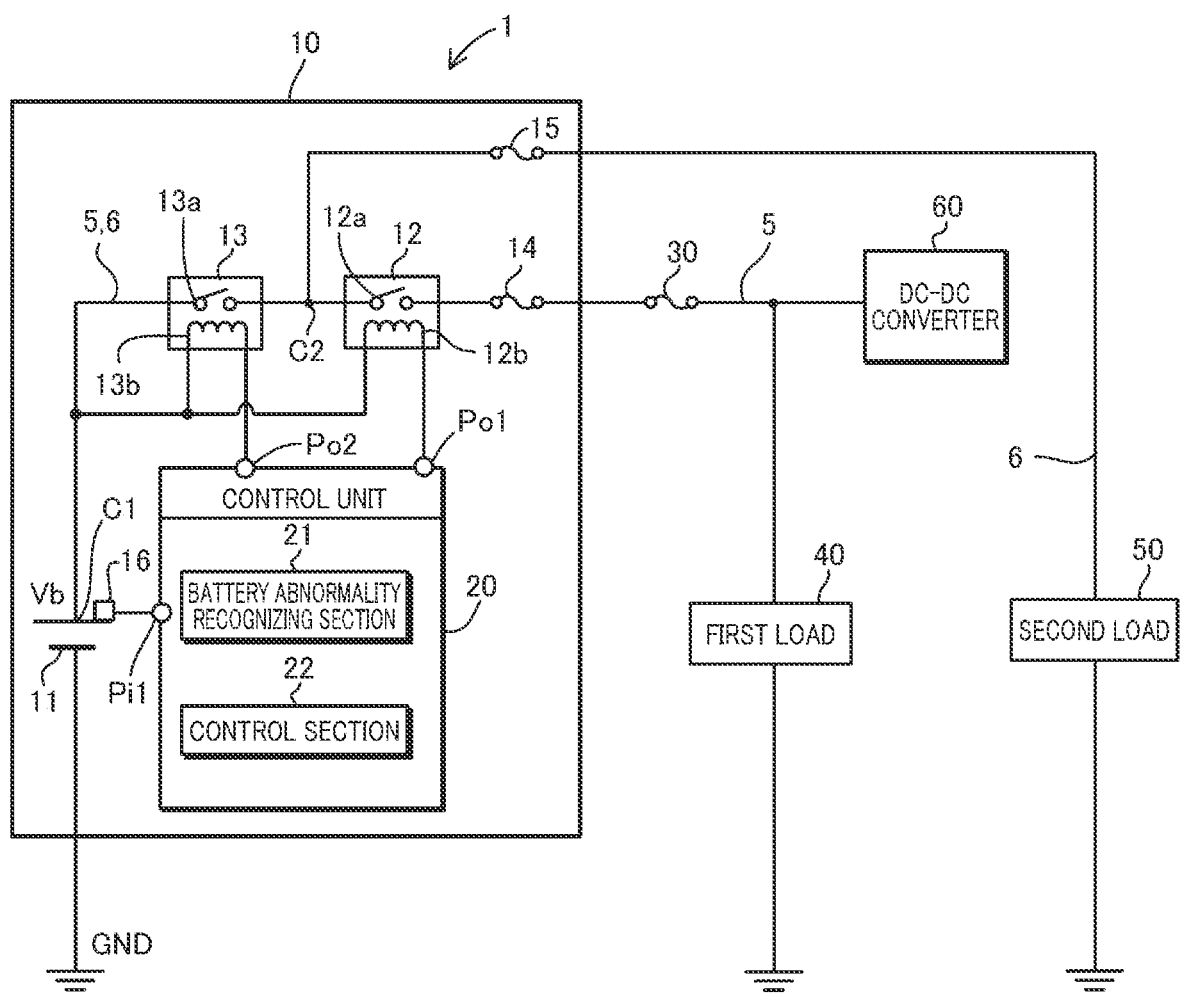
FIG. 1 is a configurational view of a power-supply control device.

A configuration of a power-supply control device 1 of the present embodiment will be described with reference to FIG. 1. The power-supply control device 1 is provided and used in an electric vehicle (such as an electric automobile or a hybrid automobile), for example. The electric vehicle is provided with a secondary battery 11, a plurality of first loads 40, a plurality of second loads 50, and a DC-DC converter 60, and the power-supply control device 1 controls the supply of electric power from the secondary battery 11 to the first loads 40, the second loads 50, and the DC-DC converter 60.

The plurality of first loads 40 and the DC-DC converter 60 correspond to the first load of the present disclosure. The secondary battery 11 is a lithium-ion battery, and the output voltage, Vb, of the secondary battery 11 is 12V, for example. The DC-DC converter 60 is connected to a high-voltage battery (not shown) and steps down the electric power output from the high-voltage battery and outputs it to the secondary battery 11 to charge the secondary battery 11.

The plurality of first loads 40 and the DC-DC converter 60 are connected to the secondary battery 11 by a first connection circuit 5 via fuses (not shown) corresponding to the respective first loads 40, and the plurality of second loads 50 are connected to the secondary battery 11 by a second connection circuit 6 via fuses (not shown) corresponding to the respective second loads 50. A conduction path shared by the first connection circuit 5 and the second connection circuit 6 is provided between a positive electrode C1 of the secondary battery 11 and a branch point C2 of the first connection circuit 5 and the second connection circuit 6.

The secondary battery 11 is housed in a battery pack 10, and the battery pack 10 is provided with a first relay 12, a second relay 13, a first fuse 14, a third fuse 15, a battery state sensor 16, and a control unit 20. The first relay 12 is provided in the middle of the first connection circuit 5 between the branch point C2 and the first load 40/the DC-DC converter 60 and switches the state between the secondary battery 11 and the first load 40/the DC-DC converter 60 between a conductive state and a disconnected state.

The second relay 13 is provided in the middle of the conduction path between the secondary battery 11 and the branch point C2 and switches the state between the secondary battery and the first load 40/the DC-DC converter 60/the second load 50 between a conductive state and a disconnected state. The first fuse 14 is blown to disconnect the supply of electric power from the secondary battery 11 to the first load 40 and the DC-DC converter 60 when passage of current at a level greater than or equal to a first predetermined level occurs. A second fuse 30 is also provided between the first fuse 14 and the first load 40/the DC-DC converter 60. The second fuse 30 is blown to disconnect the supply of electric power from the secondary battery 11 to the first load 40 and the DC-DC converter 60 when passage of current at a level greater than or equal to a second predetermined level occurs.

The third fuse 15 is blown to disconnect the supply of electric power from the secondary battery 11 to the second load 50 when passage of current at a level greater than or equal to a third predetermined level occurs. The battery state sensor 16 detects the output voltage, output current, temperature and the like of the secondary battery 11. The control unit 20 is composed of a CPU (Central Processing Unit, which corresponds to the processor of the present disclosure) (not shown), a memory, an interface circuit and the like, and the CPU reads and executes a program for controlling the power-supply control device 1 stored in the memory to function as a battery abnormality recognizing section 21 and a control section 22. A process performed by the battery abnormality recognizing section 21 corresponds to the battery abnormality recognizing process of the present disclosure, and a process performed by the control section 22 corresponds to the control process of the present disclosure.

An input port Pi1 of the control unit 20 is connected to the battery state sensor 16, and a detection signal of the battery state sensor 16 is input to the input port Pi1. The battery abnormality recognizing section 21 recognizes an abnormality of the secondary battery 11 based on the detection signal of the battery state sensor 16 input to the input port Pi1.

An output port Po1 of the control unit 20 is connected to one end of a coil $12b$ of the first relay 12, and an output port Po2 of the control unit 20 is connected to one end of a coil $13b$ of the second relay 13. The other end of the coil $12b$ of the first relay 12 and the other end of the coil 13b of the second relay 13 are in conduction with the positive electrode C1 of the secondary battery 11.

The control section 22 adjusts the output of the output port Po1 at a GND level to control a contact 12a of the first relay 12 into a conductive state or adjusts the output port Po1 at a Vb level to control the contact 12a of the first relay 12 into a disconnected state. Similarly, the control section 22 adjusts the output of the output port Po2 at a GND level to control a contact 13a of the second relay 13 into a conductive state or adjusts the output port Po2 at a Vb level to control the contact 13a of the second relay 13 into a disconnected state.

2. First Power-Supply Control Operation and Second Power-Supply Control Operation A first power-supply control operation and a second power-supply control operation performed by the control section 22 will be described with reference to the flow chart shown in FIG. 2. The control section 22 repeatedly performs processes of the flow chart shown in FIG. 2 while the first relay 12 and the second relay 13 is controlled into the conductive state and the supply of electric power from the secondary battery 11 to the first load 40, the DC-DC converter 60, and the second load 50 is performed.

Step S1 in FIG. 2 is a process performed by the battery abnormality recognizing section 21, and the battery abnormality recognizing section 21 recognizes whether an abnormality of the secondary battery 11 occurs according to whether the following first to third determination conditions hold based on a battery state detection signal of the battery state sensor 16 input to the input port Pi1.

A first determination condition is that the output voltage of the secondary battery 11 is greater than or equal to an abnormality determination voltage.

A second determination condition is that the output current of the secondary battery 11 is greater than or equal to an abnormality determination current.

A third determination condition is that the temperature of the secondary battery 11 is greater than or equal to an abnormality determination temperature.

Here, the abnormality determination current is set to a current value smaller than the above-mentioned first predetermined level, second predetermined level, and third predetermined level, at which the first fuse 14, the second fuse 30, and the third fuse 15 are blown.

The battery abnormality recognizing section 21 recognizes that an abnormality of the secondary battery 11 occurs when at least one of the above-mentioned first to third determination conditions holds. Next steps S2 to S11 are processes of the first power-supply control operation. In step S2, the control section 22 determines whether an abnormality of the secondary battery 11 is recognized by the battery abnormality recognizing section 21. The control section 22 advances the process to step S10 when an abnormality of the secondary battery 11 is recognized, and advances the process to step S3 when an abnormality of the secondary battery 11 is not recognized.

In step S10, the control section 22 adjusts the output of the output port Po1 at the Vb level to control the contact of the first relay 12 into the disconnected state (disconnection control of the first relay 12). In subsequent step S11, the control section 22 performs a first abnormality notification of making a notification of the abnormality of the secondary battery 11. For example, the control section 22 performs the first abnormality notification by displaying an abnormality notification screen on a display provided to the electric vehicle.

In next step S12, the battery abnormality recognizing section 21 recognizes whether an abnormality of the secondary battery 11 occurs by performing a process similar to step S1 described above. Here, if the abnormality of the secondary battery 11 is caused by a failure of the first load 40 or the DC-DC converter 60, the abnormality of the secondary battery 11 is resolved when the contact 12a of the first relay 12 is put into the disconnected state in the process of step S10.

Thus, in step S12, an abnormality of the secondary battery 11 is recognized by the battery abnormality recognizing section 21 when the contact 12a of the first relay 12 is maintained in the conductive state due to a failure of the first relay 12 or when the abnormality of the secondary battery 11 is caused by a failure of the second load 50.

In subsequent step S13, the control section 22 determines whether an abnormality of the secondary battery 11 is recognized by the battery abnormality recognizing section 21. When an abnormality of the secondary battery 11 is recognized by the battery abnormality recognizing section 21, the control section 22 advances the process to step S20 and controls the contact 13a of the second relay 13 into the disconnected state (disconnection control of the second relay 13). In this manner, the supply of electric power from the secondary battery 11 to the DC-DC converter 60 and the first load 40 is disconnected, and the secondary battery 11 is protected.

On the other hand, when an abnormality of the secondary battery 11 is not recognized by the battery abnormality recognizing section 21, the control section 22 advances the process to step S3, in which case the contact 13a of the second relay 13 is maintained in the conductive state and thus the supply of electric power from the secondary battery 11 to the second load 50 is continued. This can avoid the loss of the function operated by the second load 50 due to an abnormality of the secondary battery 11.

In addition, when the disconnection control of the second relay 13 is performed in step S20 and the contact 13a of the second relay 13 is still maintained in the conductive state and the secondary battery 11 continues to output overcurrent due to a failure of the second relay 13, the first fuse 14, the second fuse 30, or the third fuse 15 is blown and the over-discharge from the secondary battery 11 is thereby stopped, so that the secondary battery 11 is protected.

Here, the second load 50 includes, for example, one or more of a wiper, a headlight, a power steering, an ignition, an electric parking brake (EPB), an engine water pump, a fuel injector (FI), an anti-lock braking system (ABS), an all-wheel drive (AWD) system, and a drive-by-wire (DBW) system. These are devices that exert functions such as running, stopping, and turning or devices related to visibility at night or in case of rain. The first load 40 is other than the device of the second load mentioned above and may include one or more of an audio device or an air-conditioner.

In the case where the second load 50 and the first load 40 are configured as described above, when an abnormality of the secondary battery 11 occurs due to a failure of the first loads 40 or the DC-DC converter 60, the first power-supply control operation is performed by the control section 22, and the contact 12a of the first relay 12 is put into the disconnected state. In this manner, the abnormality of the secondary battery 11 is resolved, and thus the exertion of the functions of the above-mentioned device of the second load 50 such as running, stopping, and turning or the securing of visibility at night or in case of rain is not affected.

3. Other Embodiments

In the above-described embodiment, the second relay 13 is provided, and the control section 22 performs the second power-supply control operation of disconnecting the second relay 13 in step S20 when the disconnection control of the first relay 12 is performed in step S10 in FIG. 2 and an abnormality of the secondary battery 11 is not still resolved. In another configuration, the second relay 13 may be eliminated and the second power-supply control operation may not be performed.

Although the first fuse 14, the second fuse 30, and the third fuse 15 are provided in the above-described embodiment, any or all of these fuses may be eliminated.

In the above-described embodiment, the battery abnormality recognizing section 21 recognizes an abnormality of the secondary battery 11 according to the above-mentioned first to third determination conditions. In another embodiment, an abnormality of the secondary battery 11 may be recognized according to one or two of the above-mentioned first to third determination conditions. An abnormality of the secondary battery 11 may also be recognized by using a determination condition other than the above-mentioned first to third determination conditions.

Although a lithium-ion battery is illustrated as an example of the secondary battery 11 in the above-described embodiment, the present invention is applicable to a case of using a secondary battery of another type.

Note that FIG. 1 is a schematic diagram in which the configuration of the power-supply control device 1 is divided by major processes for easy understanding of the invention of the present application, and the configuration of the power-supply control device 1 may be divided in a different manner. A process of each component may be performed by a single hardware unit, or may be performed by a plurality of hardware units. A process of each component shown in FIG. 2 may be performed by a single program, or may be performed by a plurality of programs.

4. Configurations Supported by Above-Described Embodiment

The above-described embodiment is a specific example of the following configurations.

(First Item) A power-supply control device that controls supply of electric power from a secondary battery to a first load and a second load, the power-supply control device comprising: a first connection circuit connecting the first load and the secondary battery; a second connection circuit connecting the second load and the secondary battery; a first relay provided in a middle of the first connection circuit; and a processor that performs a battery abnormality recognizing process of recognizing an abnormality of the secondary battery and a control process of performing a first power-supply control operation of controlling the first relay into a conductive state to enable supply of electric power from the secondary battery to the first load by the first connection circuit and supply of electric power from the secondary battery to the second load by the second connection circuit and, when an abnormality of the secondary battery is recognized in the battery abnormality recognizing process during the first power-supply control operation, performing a second power-supply control operation of controlling the first relay into a disconnected state to stop the supply of electric power from the secondary battery to the first load by the first connection circuit and maintain the supply of electric power from the secondary battery to the second load by the second connection circuit.

According to the power-supply control device of the first item, in the control process, when an abnormality of the secondary battery is recognized during the first power-supply control operation of controlling the first relay into the conductive state to enable supply of electric power from the secondary battery to the first load by the first connection circuit and supply of electric power from the secondary battery by the second connection circuit, the processor performs the second power-supply control operation of controlling the first relay into the disconnected state to stop the supply of electric power from the secondary battery to the first load by the first connection circuit and maintain the supply of electric power from the secondary battery to the second load by the second connection circuit. Thus, when an abnormality of the secondary battery occurs due to an abnormality of the first load, such as flowing of overcurrent from the secondary battery to the first load due to a failure of the first load, it is possible to resolve the abnormality of the secondary battery to protect the secondary battery and maintain the supply of electric power to the second load.

(Second Item) The power-supply control device according to the first item, further comprising: a conduction path provided between the secondary battery and the first relay, the conduction path being shared by the first connection circuit and the second connection circuit; and a second relay provided in a middle of the conduction path, wherein in the control process, the processor performs a third power-supply control operation of controlling the second relay into a disconnected state when the second power-supply control operation of controlling the first relay into the disconnected state is performed and a state in which an abnormality of the secondary battery is recognized in the battery abnormality recognizing process is still not resolved.

According to the power-supply control device of the second item, when the first relay is not put into the disconnected state even by controlling the first relay into the disconnected state due to a failure of the first relay, or when the abnormality of the secondary battery is caused by the second load, it is possible to protect the secondary battery by putting the second relay into the disconnected state.

(Third Item) The power-supply control device according to the first item or the second item, further comprising: a fuse provided in a middle of the first connection circuit, wherein the fuse is blown when passage of current at a level greater than or equal to a predetermined level occurs.

According to the power-supply control device of the third item, when the first relay is not put into the disconnected state even by controlling the first relay into the disconnected state due to a failure of the first relay, it is possible to protect the secondary battery by blowing of the fuse.

(Fourth Item) A movable body comprising: the power-supply control device according to any one of the first item to third item and an electric motor, wherein when an abnormality of the secondary battery is recognized in the battery abnormality recognizing process and the second power-supply control operation is performed in the control process, the supply of electric power from the secondary battery to the second load by the second connection circuit is maintained, the second load comprising one or more of a wiper, a headlight, a power steering, an ignition, an electric parking brake (EPB), an engine water pump, a fuel injector (FI), an anti-lock braking system (ABS), an all-wheel drive (AWD) system, or a drive-by-wire (DBW) system, and the first relay in the first connection circuit is controlled into the disconnected state, and the supply of electric power from the secondary battery to the first load is disconnected, the secondary battery being located upstream from the first relay in the first connection circuit, the first load being located downstream from the first relay in the first connection circuit, the first load comprising at least a DC-DC converter and not comprising the second load.

In the movable body of the fourth item, the second load is a device that exerts functions such as running, stopping, and turning or a device related to visibility at night or in case of rain. The first load is other than the device of the second load mentioned above. When the abnormality of the secondary battery is caused by a failure of a DC-DC converter as the first load or the first load other than a DC-DC converter, the abnormality of the secondary battery 11 is resolved by putting the first relay 12 into the disconnected state, and thus the exertion of the functions of the device of the second load such as running, stopping, and turning is not affected.

(Fifth Item) The movable body according to the fourth item, wherein the first load disconnected from the secondary battery located upstream in the first connection circuit and located downstream in the first connection circuit comprises one or more of an audio device or an air-conditioner.

In the movable body of the fifth item, the first load is other than a device that exerts functions such as running, stopping, and turning and a device related to visibility at night or in case of rain. When the abnormality of the secondary battery is caused by a failure of a DC-DC converter as the first load or the first load other than a DC-DC converter, the abnormality of the secondary battery is resolved by putting the first relay into the disconnected state, and thus the exertion of the functions of the device of the second load such as running, stopping, and turning is not affected.

REFERENCE SIGNS LIST

1 . . . power-supply control device, 5 . . . first connection circuit, 6 . . . second connection circuit, 10 . . . battery pack, 11 . . . secondary battery, 12 . . . first relay, 13 . . . second relay, 14 . . . first fuse, 15 . . . third fuse, 16 . . . battery state sensor, 20 . . . control unit, 21 . . . battery abnormality recognizing section, 22 . . . control section, 30 . . . second fuse, 40 . . . first load, 50 . . . second load, 60 . . . DC-DC converter

What is claimed is:

1. A power-supply control device that controls supply of electric power from a secondary battery to a first load and a second load, the power-supply control device comprising:
    a first connection circuit connecting the first load and the secondary battery;
    a second connection circuit connecting the second load and the secondary battery;
    a first relay provided in a middle of the first connection circuit;
    a conduction path provided between the secondary battery and the first relay, the conduction path being shared by the first connection circuit and the second connection circuit;
    a second relay provided in a middle of the conduction path; and
    a processor, wherein the processor is configured to
        perform a battery abnormality recognizing process of recognizing an abnormality of the secondary battery,
        perform a control process of performing a first power-supply control operation of controlling the first relay into a conductive state to enable supply of electric power from the secondary battery to the first load by the first connection circuit and supply of electric power from the secondary battery to the second load by the second connection circuit,
        when an abnormality of the secondary battery is recognized in the battery abnormality recognizing process during the first power-supply control operation, perform a second power-supply control operation of controlling a contact of the first relay into a disconnected state to stop the supply of electric power from the secondary battery to the first load by the first connection circuit and maintain the supply of electric power from the secondary battery to the second load by the second connection circuit,
        in the control process, perform a third power-supply control operation of controlling a contact of the second relay into a disconnected state when the second power-supply control operation of controlling the first relay into the disconnected state is performed and a state in which an abnormality of the secondary battery is recognized in the battery abnormality recognizing process is still not resolved.

2. The power-supply control device according to claim 1, further comprising:
    a fuse provided in a middle of the first connection circuit, wherein the fuse is blown when passage of current at a level greater than or equal to a predetermined level occurs.

3. A movable body comprising:
    a power-supply control device and an electric motor, wherein
    the power-supply control device controls supply of electric power from a secondary battery to a first load and a second load, the power-supply control device comprising:
    a first connection circuit connecting the first load and the secondary battery;
    a second connection circuit connecting the second load and the secondary battery;
    a first relay provided in a middle of the first connection circuit;
    a conduction path provided between the secondary battery and the first relay, the conduction path being shared by the first connection circuit and the second connection circuit;
    a second relay provided in a middle of the conduction path; and
    a processor, wherein the processor is configured to
        perform a battery abnormality recognizing process of recognizing an abnormality of the secondary battery,
        perform a control process of performing a first power-supply control operation of controlling the first relay into a conductive state to enable supply of electric power from the secondary battery to the first load by the first connection circuit and supply of electric power from the secondary battery to the second load by the second connection circuit,
        when an abnormality of the secondary battery is recognized in the battery abnormality recognizing process during the first power-supply control operation, perform a second power-supply control operation of controlling a contact of the first relay into a disconnected state to stop the supply of electric power from the secondary battery to the first load by the first connection circuit and maintain the supply of electric power from the secondary battery to the second load by the second connection circuit, and in the control process, perform a third power-supply control operation of controlling a contact of the second relay into a disconnected state when the second power-supply control operation of controlling the first relay into the disconnected state is performed and a state in which an abnormality of the secondary battery is recognized in the battery abnormality recognizing process is still not resolved, wherein when an abnormality of the secondary battery is recognized in the battery abnormality recognizing process and the second power-supply control operation is performed in the control process, the supply of electric power from the secondary battery to the second load by the second connection circuit is maintained, the second load comprising one or more of a wiper, a headlight, a power steering, an ignition, an electric parking brake (EPB), an engine water pump, a fuel injector (FI), an anti-lock braking system (ABS), an all-wheel drive (AWD) system, or a drive-by-wire (DBW) system, and the contact of the first relay in the first connection circuit is controlled into the disconnected state, and the supply of electric power from the secondary battery to the first load is disconnected, the secondary battery being located upstream from the first relay in the first connection circuit, the first load being located downstream from the first relay in the first connection circuit, the first load comprising at least a DC-DC converter and not comprising the second load.

4. The movable body according to claim 3, wherein the first load disconnected from the secondary battery located upstream in the first connection circuit and located downstream in the first connection circuit comprises one or more of an audio device or an air-conditioner.

* * * * *